United States Patent
Kuroda et al.

[11] Patent Number: 5,834,967
[45] Date of Patent: Nov. 10, 1998

[54] SEMICONDUCTOR INTEGRATED CIRCUIT DEVICE

[75] Inventors: Tadahiro Kuroda, Yokohama; Tetsuya Fujita, Kawasaki, both of Japan

[73] Assignee: Kabushiki Kaisha Toshiba, Tokyo, Japan

[21] Appl. No.: 706,995

[22] Filed: Sep. 3, 1996

[30] Foreign Application Priority Data

Sep. 1, 1995 [JP] Japan .................................. 7-225576

[51] Int. Cl.$^6$ .............................. G05F 3/02; G05F 3/16
[52] U.S. Cl. ......................... 327/543; 327/540; 327/541; 327/545; 327/546
[58] Field of Search ..................................... 327/541, 543, 327/540, 538, 545, 546; 323/315, 313

[56] References Cited

U.S. PATENT DOCUMENTS

| | | | |
|---|---|---|---|
| 4,686,449 | 8/1987 | Jeffrey et al. | 323/231 |
| 5,260,646 | 11/1993 | Ong | 323/349 |
| 5,508,604 | 4/1996 | Keeth | 323/314 |
| 5,530,395 | 6/1996 | Ting | 327/543 |
| 5,610,550 | 3/1997 | Furutani | 327/543 |

*Primary Examiner*—Timothy P. Callahan
*Assistant Examiner*—An T. Luu
*Attorney, Agent, or Firm*—Leob & Loeb LLP

[57] ABSTRACT

A semiconductor integrated circuit device includes a leak detection circuit which can be realized by small pattern area provides voltage Vb through two transistors M1$n$ and M2$n$, which are caused to be operative in the sub-threshold area without use of a resistor at the gate of a leak current detection transistor ML$n$. The leak current detection magnification does not become dependent upon power supply voltage and temperature. Thus, detection of the leakage current can be precisely carried out.

36 Claims, 7 Drawing Sheets

| | CONFIGURATION OF FIG. 13 | CONFIGURATION OF FIG. 1 | CONFIGURATION OF FIG. 4 |
|---|---|---|---|
| Vdd DEPENDENCY OF $\frac{IL.LSI}{IL.LCM}$ (%) | -22 ~ +42 | -1.8 ~ +5.6 | -1.8 ~ +5.6 |
| TEMPERATURE DEPENDENCY OF $\frac{IL.LSI}{IL.LCM}$ (%) | -20 ~ +25 | -1.5 ~ +1.5 | -1.5 ~ +1.5 |
| Vthn DEPENDENCY OF $\frac{IL.LSI}{IL.LCM}$ (%) | -0.7 ~ +15 | -0.4 ~ +9.6 | -0.4 ~ +9.6 |
| RESPONSE TIME ($\mu$s) | 0.55 | 0.40 | 0.10 |
| AREA ($\mu m^2$) | 33251 | 539 | 669 |

SEMICONDUCTOR INTEGRATED CIRCUIT DEVICE

BACKGROUND OF THE INVENTION

This invention relates to a semiconductor integrated circuit device, and more particularly to a semiconductor integrated circuit device used for low voltage CMOS LSI.

As one of the effective method for reducing power consumption of the CMOS integrated circuit, there is a method of reducing the power supply voltage. However, when the power supply voltage is lowered, the speed in operation of the CMOS circuit greatly becomes dependent upon the threshold voltage ($V_{th}$) of the MOS transistor. For example, in the case of 3.3 V power supply, even if $V_{th}$ is increased by 0.15 V, the speed in operation of the circuit is to such a degree that it is caused to be low by 5%. However, in the case of 1 V power supply, the speed in operation of the circuit would be decreased by no less than 10% which is twice greater than the above.

In view of the above, the circuit technologies for reducing variations of $V_{th}$ have been developed. For example, in the circuit described in the reference document: Kobayashi, T. and Sakurai, T., "Self-Adjusting Threshold-Voltage Scheme (SATS) for Low-Voltage High-Speed Operation." Proc. IEEE 1994 CICC, pp. 271–274, May 1994, the leakage current detection circuit for LSI and the substrate bias circuit are used to carry out an operation as described below. Namely, since leakage current is increased so that it is above the target value when $V_{th}$ is lower than the target value, the detected leakage current becomes greater than the set value. As a result, the substrate bias circuit becomes operative so that the substrate bias becomes deep. Thus, the threshold voltage $V_{th}$ is corrected so that it is shifted to the higher value side. In contrast, when the threshold voltage $V_{th}$ is higher than the target value, the leakage current is decreased so that it is below the target value. Accordingly, the detected leakage current becomes smaller than the set value. As a result, the operation of the substrate bias circuit is stopped so that the substrate bias becomes shallow. Accordingly, the threshold voltage $V_{th}$ is corrected so that it is shifted to the lower value side. Thus, variations of $V_{th}$ the MOS transistor manufactured so that $V_{th}=\pm 0.15$ V can be reduced to $\pm 0.05$ V in this way by the circuit technology.

The drain current of the MOS transistor in the sub-threshold region, i.e., in the state where it is in the shallow ON state is expressed by the following equation:

$$I_{DS} = \frac{I_0}{W_0} W \cdot 10^{(V_{GS}-V_{TC})/S} \quad \text{Equation (1)}$$

Here, S in the equation (1) is so called sub-threshold swing (also referred to as tailing coefficient), and indicates value of $V_{GS}$ required for allowing the leakage current to be lowered by one figure (digit). This S parameter is expressed as follows.

$$S = \frac{kT}{q} \left(1 + \frac{C_{DP}}{C_{OX}}\right) \ln 10 \quad \text{Equation (2)}$$

In the above equation, $V_{TC}$ is $V_{GS}$ when a constant drain current $I_O$ begins flowing in the transistor having channel width $W_O$. It is seen from the equation (2) that S is dependent upon temperature. Accordingly, the leakage current of LSI is expressed by the following equation:

$$I_{LLSI} = \frac{I_0}{W_0} W_{LSI} \cdot 10^{-V_{TC}/S} \quad \text{Equation (3)}$$

Figure 13:
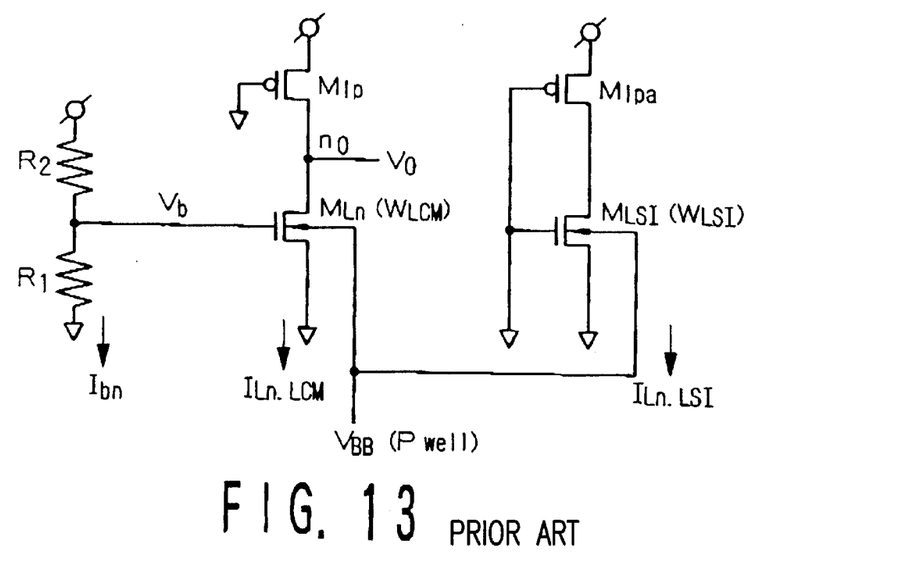
FIG. 13 is a circuit diagram showing the configuration of a conventional leakage current detection circuit.

The configuration of the conventional leakage current detection circuit is shown in FIG. 13.

In this circuit, a predetermined voltage $V_O$ is applied to a node of the drain of a P-channel MOS transistor $M_{1p}$ as load in which the gate is grounded and the source is connected to the power supply and the drain of an N-channel MOS transistor $M_{Ln}$ of which source is grounded, and output voltage $V_b$ of a resistor voltage dividing circuit composed of resistors R1 and R2 is applied to the gate thereof.

This N-channel MOS transistor $M_{Ln}$ is leakage current detecting transistor. Two transistors located at the right side of the N-channel MOS transistor $M_{Ln}$ equivalently represent the entirety of LSI, and are represented by a P-channel MOS transistor $M_{1pa}$ in which the gate is grounded and the source is connected to the power supply and an N-channel MOS transistor $M_{LS1}$ in which the gate and the source are grounded and the drain is connected to the drain of the P-channel MOS transistor $M_{1pa}$.

The leakage current detected by the leakage current detection circuit is expressed, from the above equation (1), by the following equation.

$$I_{LnLCM} = \frac{I_0}{W_0} W_{LLCM} \cdot 10^{(V_b-V_{TC})/S} \quad \text{Equation (4)}$$

Here, input voltage $v_b$ is given by the following equation.

$$V_b = \frac{R_1}{R_1+R_2} V_{DD} = \eta V_{DD} \quad \text{Equation (5)}$$

Accordingly, ratio between leakage current of the entirety of LSI and leakage current detected by the leakage current detection circuit (hereinafter referred to as leakage current detection magnification) is expressed by the following equation.

$$\frac{I_{LnLSI}}{I_{LnLCM}} = \frac{W_{LSI}}{W_{LCM}} \cdot 10^{-\eta V_{DD}/S} \quad \text{Equation (6)}$$

As is clear from the equation (6), the conventional leakage current detection circuit is such that the leakage current detection magnification is dependent upon the power supply voltage $V_{DD}$ and temperature (S is dependent upon temperature as described above). Therefore, leakage current of LSI could not be precisely detected.

Moreover, the leakage current detecting MOS transistor $M_{Ln}$ requires large channel width ($W_{LCM}$). Accordingly, capacity parasitic to the drain of the leakage current detecting MOS transistor $M_{Ln}$ is great, whereas current ($I_{LnLCM}$) flowing in the leakage current detecting transistor $M_{Ln}$ is small. Therefore, the response time of the leakage current detection circuit became very long, resulting in the problem that convergence of control of the substrate bias is not satisfactory.

Furthermore, since the input voltage $V_b$ is obtained by voltage division by resistors, if attempt is made to reduce quantity of consumption of current $I_{bn}$ flowing in the resistor, resistor of large resistance value is required. For example, in order to allow the current $I_{bn}$ to be equal to 1 µA, resistor of 3 M ohms is required by R1 and R2 when $V_{DD}$ is equal to 3 V. In general, resistors are provided by diffusion (diffused) layer. When the sheet resistance of the diffusion layer is assumed to be 100 ohms, layout pattern having width of 1 µm and length of 30 mm is required. Such layout pattern occupies large area. Thus, this was unsatisfactorily contradictory to the requirements of miniaturization and high integration.

SUMMARY OF THE INVENTION

The primary object of the present invention is to provide is invention has been made in view of actual circumstances as described above, and its object is to provide a semiconductor integrated circuit device including a leakage current detection circuit which has leakage current detection magnification which is not dependent upon power supply voltage, temperature and/or manufacturing unevenness.

The secondary object of the present invention is to provide a semiconductor device which is operable at a high speed, and is permitted to undergo layout by smaller pattern area.

In accordance with the first aspect of this invention, there is provided a semiconductor integrated circuit device comprising:

- a first MOS transistor of a first conductivity type having source connected to a first power supply and drain connected to a second power supply through a load;
- a second MOS transistor of the first conductivity type having drain connected to gate of the first MOS transistor of the first conductivity type, source connected to the first power supply, and gate connected to a current source; and
- a third MOS transistor of the first conductivity type having source connected to the gate of the first MOS transistor of the first conductivity type, drain connected to the current source, and gate connected to the drain, wherein absolute value of difference between potential on the gate of the second MOS transistor of the first conductivity type and potential of the first power supply is caused to be equal to threshold voltages of the second and the third MOS transistors of the first conductivity type, or is caused to be lower than the latter so that the second and third MOS transistors of the first conductivity type are driven in the sub-threshold region.

In this integrated circuit of the first aspect, since two transistors are caused to be operative in the sub-threshold region to produce input voltage $V_b$ for the leakage current detecting transistor, the leakage current detection magnification does not become dependent upon the power supply voltage and/or temperature. Thus, it is possible to precisely detect leakage current of the N-channel MOS transistor or the P-channel MOS transistor of LSI. In addition, since the input voltage $V_b$ can be generated by transistors without use of the resistor, the leakage current detection circuit is permitted to undergo layout by smaller pattern area.

According to the second aspect of the present invention, there is provided a semiconductor circuit comprising:

- a first MOS transistor of a first conductivity type of which source is connected to a first power supply;
- a second MOS transistor of the first conductivity type having drain connected to gate of the first MOS transistor of the first conductivity type, source connected to the first power supply, and gate connected to a current source;
- a third MOS transistor of the first conductivity type having source connected to the gate of the first MOS transistor of the first conductivity type, drain connected to the current source, and gate connected to the drain; and
- a fourth MOS transistor of the first conductivity type having source connected to drain of the first MOS transistor of the first conductivity type, drain connected to a second power supply through a load, and gate to which a predetermined potential is applied, wherein absolute value of difference between potential on the gate of the second MOS transistor of the first conductivity type and potential of the first power supply is caused to be equal to threshold voltages of the second and third MOS transistors of the first conductivity type, or is caused to be lower than the latter so that the second and third MOS transistors of the first conductivity type are driven in the sub-threshold region, and the channel width of the fourth MOS transistor of the first conductivity type is caused to be smaller than the channel width of the first MOS transistor of the first conductivity type.

In accordance with the second aspect of this invention, in addition to the operation similar to the first aspect, potential of the drain terminal of the leakage current detecting MOS transistor is clamped. As a result, potential on the drain of the leakage current detecting MOS transistor has a small voltage swing. Thus, the leakage current of the N-channel MOS transistor or the P-channel MOS transistor can be detected at a high speed.

Furthermore, in accordance with the third aspect, MOS transistor is used as load of the leakage current detection circuit and its gate potential can be desirably controlled from the external of the chip through the external terminal. Thus, the leakage current detection magnification can be desirably set.

DESCRIPTION OF THE PREFERRED EMBODIMENTS

Several preferred embodiments of this invention will now be described in detail with reference to the attached drawings.

Figure 1:
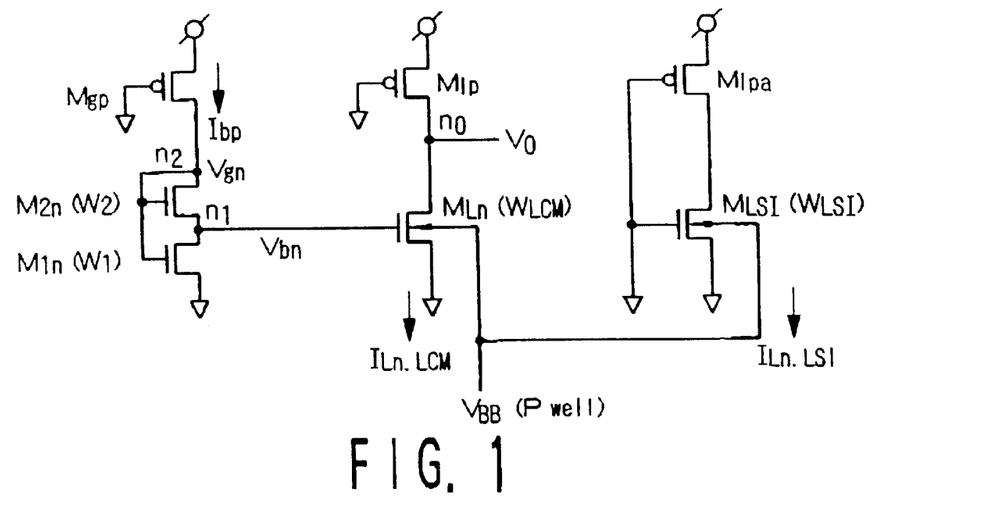
FIG. 1 is a circuit diagram showing a configuration of a first embodiment of this invention.

The configuration of a first embodiment of a semiconductor integrated circuit device according to this invention is shown in FIG. 1. This semiconductor integrated circuit device is the same as the prior art of FIG. 13 in that N-channel MOS transistor $M_{Ln}$ is provided for detection of leakage current with respect to the N-channel MOS transistor $M_{LSI}$ which equivalently represents LSI. In order to produce gate voltage $V_{bn}$ with respect to the N-channel MOS transistor $M_{Ln}$, there are provided an N-channel MOS transistor ($M_{1n}$) of which source is grounded and an N-channel MOS transistor ($M_{2n}$) in which a current source $M_{gp}$ is connected to the drain and the source is connected to the drain of the N-channel MOS transistor $M_{1n}$, wherein the gate terminal of the N-channel MOS transistor $M_{1n}$, the gate terminal of the N-channel MOS transistor $M_{2n}$, the drain terminal of the N-channel MOS transistor $M_{2n}$ and the drain terminal of the MOS transistor constituting the current source $M_{gp}$ are connected; and the connection node of the drain terminal of the N-channel MOS transistor $M_{1n}$ and the source terminal of the N-channel MOS transistor $M_{2n}$ is connected to the gate of the N-channel MOS transistor $M_{Ln}$.

In this case, the N-channel MOS transistor $M_{1n}$ and the N-channel MOS transistor $M_{2n}$ are such that the current value $I_{bp}$ of the current source $M_{gp}$ and the channel widths of the N-channel MOS transistor $M_{1n}$ and the N-channel MOS transistor $M_{2n}$ are selected so that both transistors are operative in the sub-threshold region. When setting is made in such a way, the potential difference between $V_{gn}$ which is potential of the gate terminal of the N-channel MOS transistor $M_{1n}$ and the ground potential GND is substantially equal to the threshold voltages of the N-channel MOS transistor $M_{1n}$ and the N-channel MOS transistor $M_{2n}$, or becomes smaller than the latter.

In the semiconductor integrated circuit device of the first embodiment of this invention thus constructed, since the N-channel MOS transistor $M_{1n}$ and the N-channel MOS transistor $M_{2n}$ are operative in the sub-threshold region, their drain currents are expressed as the above-mentioned equation (1). Because both drain currents are equal to each other, the following equation (7) is provided.

$$W_1 \cdot 10^{(V_g - V_{TC1})/S} = W_2 \cdot 10^{(V_g - V_b - V_{TC2})/S}, \quad \text{Equation (7)}$$

$$\therefore V_b = (V_{TC1} - V_{TC2}) + S \cdot \log \frac{W_2}{W_1} \approx S \cdot \log \frac{W_2}{W_1}$$

Figure 2A:
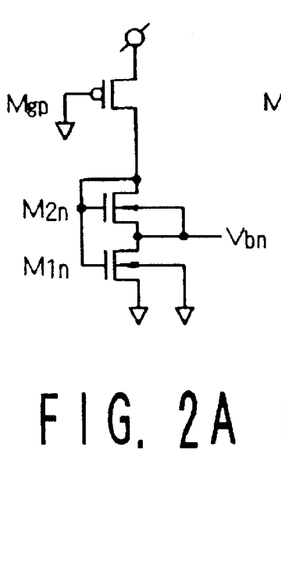
FIGS. 2A–2C are circuit diagrams for explaining how to give substrate potential in the configuration of FIG. 1.

Here, when the drain of the N-channel MOS transistor $M_{1n}$ and the substrate terminal of the N-channel MOS transistor $M_{2n}$ are connected as shown in FIG. 2A, difference between threshold voltages of the both transistors becomes substantially equal to zero. Accordingly, approximation of the above-mentioned equation (7) holds. In this case, the leakage current detection magnification of the leakage current of N-channel MOS transistor of LSI is expressed as follows:

$$\frac{I_{LLSI}}{I_{LLCM}} = \frac{W_{LSI}}{W_{LCM}} \cdot 10^{-\log \frac{W_2}{W_1}} = \frac{W_{LSI}}{W_{LCM}} \cdot \frac{W_1}{W_2} \quad \text{Equation (8)}$$

Thus, it is possible to make a design by the ratio between the channel width W1 of the N-channel MOS transistor $M_{1n}$ and the channel width W2 of the N-channel MOS transistor $M_{2n}$ without undergoing, by any means, influence of change of the power supply voltage and/or variations of devices.

Figure 2B:
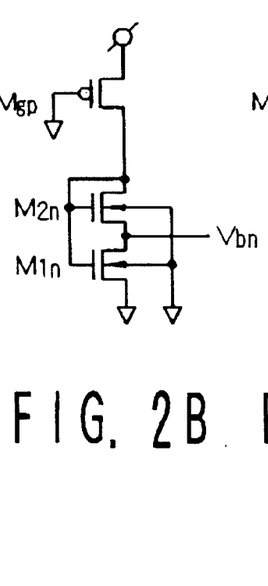
Figure 2C:
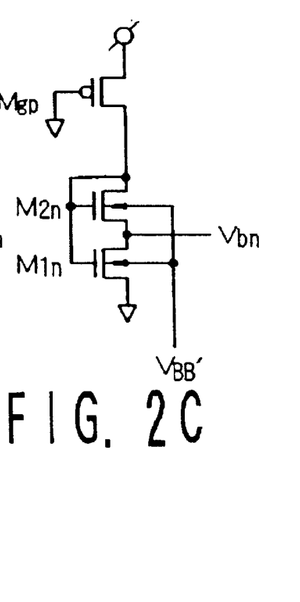

However, in order to permit the circuit connection shown in FIG. 2A, the substrate of the N-channel MOS transistor $M_{1n}$ and the substrate of the N-channel MOS transistor $M_{2n}$ must be electrically isolated. In the case where the both substrates are not electrically isolated, there results a circuit connection where the both substrate terminals are connected to each other as shown in FIG. 2B. In this case, since the substrate bias is applied to the N-channel MOS transistor $M_{2n}$, the threshold voltage of the N-channel MOS transistor $M_{2n}$ slightly becomes higher than that of the N-channel MOS transistor $M_{1n}$ by the back gate effect. As a result, approximation of the equation (7) does not hold. Accordingly, the leakage current detection magnification has small temperature dependency. To solve this, when negative bias is applied to the common substrate of the N-channel MOS transistor $M_{1n}$ and the N-channel MOS transistor $M_{2n}$ as shown in FIG. 2C, this dependency can be further reduced.

Figure 9:
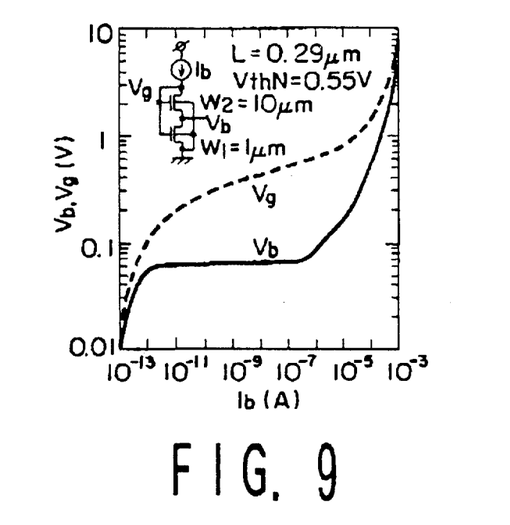
FIG. 9 is a graph showing the result obtained by simulating the $V_{bn}$-$I_{bn}$ characteristic of FIG. 1.

The result obtained by simulating the $V_{bn}$–$I_{bn}$ characteristic of FIG. 1 is shown in FIG. 9. As indicated by the equation (7), in the sub-threshold region where the potential difference between the gate potential $V_g$ of the N-channel MOS transistor $M_{1n}$ and the N-channel MOS transistor $M_{2n}$ and ground potential GND is smaller than the threshold voltage $V_{thn}$=0.55 V of the N-channel MOS transistor $M_{1n}$, the N-channel MOS transistor $M_{2n}$, $V_b$ becomes constant value without depending upon the current $I_b$. Namely, the $V_b$ can be determined only by the ratio of W2/W1 of channel widths of the N-channel MOS transistor $M_{1n}$ and the N-channel MOS transistor $M_{2n}$ without undergoing, by any means, influence of change of the power supply voltage and/or variations of devices.

Figure 10:
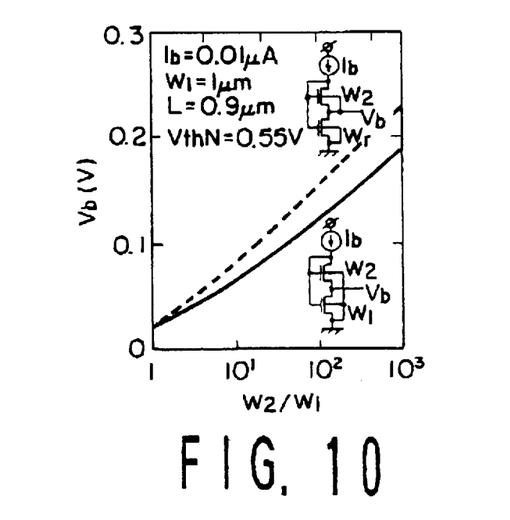
FIG. 10 is a graph showing the result obtained by simulating the $V_{bn}$-(W2/W1) characteristic of FIG. 1.

The result obtained by simulating the $V_b$, N-channel MOS transistor (W2/W1) characteristic of FIG. 1 is shown in FIG. 10. The case where the substrate potential of the N-channel MOS transistor $M_{1n}$ and the substrate potential of the N-channel MOS transistor $M_{2n}$ are electrically isolated and no substrate bias of the N-channel MOS transistor $M_{2n}$ is applied (see FIG. 2A) is indicated by broken lines. In contrast, the case where the substrate potentials of the N-channel MOS transistors $M_{1n}$ and $M_{2n}$ cannot be electrically isolated, so any substrate bias is applied to the N-channel MOS transistor $M_{2n}$ (see FIG. 2B) is indicated by the solid line. In the case of the latter, the threshold voltage of the N-channel MOS transistor $M_{2n}$ slightly becomes high because of the substrate bias effect. As a result, the term of ($V_{TC1}$–$V_{TC2}$) of the equation (7) does not become equal to zero, but takes negative value. Therefore, a value slightly lower than that of the former is obtained. For this reason, the latter case has small temperature dependency. However, when viewed from practical use, it can be considered that such a temperature dependency falls, in dependency upon use purpose, within the range where there is no influence.

Figure 3:
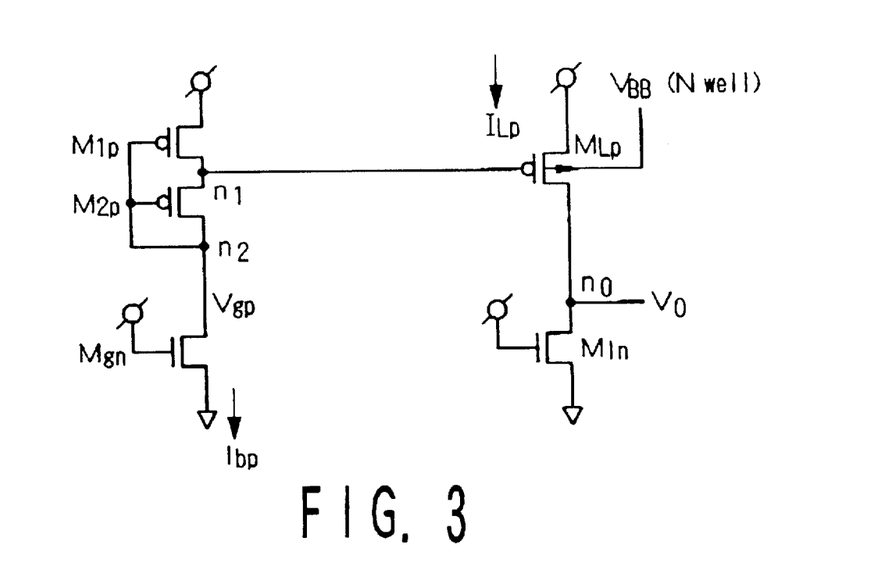
FIG. 3 is a circuit diagram showing a variation of configuration of a second embodiment of this invention.

FIG. 3 shows a second embodiment of this invention caused to be of a structure in which conductivity types of the transistors in the configuration of FIG. 1 are inverted.

There are provided, in order to produce gate voltage $V_{bp}$ with respect to a P-channel MOS transistor $M_{Lp}$ for detection of leakage current, a P-channel MOS transistor ($M_{1p}$) of which source is connected to the power supply and a P-channel MOS transistor ($M_{2p}$) in which a current source $M_{gn}$ is connected to the drain, and the source is connected to the drain of the P-channel MOS transistor $M_{1p}$, wherein the gate terminal of the P-channel MOS transistor $M_{1p}$, the gate terminal of the P-channel MOS transistor $M_{2p}$, the drain terminal of the P-channel MOS transistor $M_{2p}$, and the drain terminal of the MOS transistor constituting the current source $M_{gn}$ are connected; and the node of the drain terminal of the P-channel MOS transistor $M_{1p}$ and the source terminal of the P-channel MOS transistor $M_{2p}$ is connected to the gate of the P-channel MOS transistor $M_{Lp}$.

Here, the P-channel MOS transistor $M_{1p}$ and the P-channel MOS transistor $M_{2p}$ are such that the current value $I_{bp}$ of the current source $M_{gn}$ and the channel widths of the P-channel MOS transistor $M_{1p}$ and the P-channel MOS transistor $M_{2p}$ are selected so that both transistors are operative in the sub-threshold region. When setting is made in such a way, the potential difference between the power supply potential and $V_{gp}$ which is potential of the gate terminal of the P-channel MOS transistor $M_{1p}$ becomes substantially equal to the threshold voltages of the P-channel MOS transistor $M_{1p}$ and the P-channel MOS transistor $M_{2p}$, or becomes smaller than the latter.

Also in this case, leakage current of the P-channel MOS transistor of LSI can be detected exactly in the same manner as in the case of FIG. 1.

Figure 4:
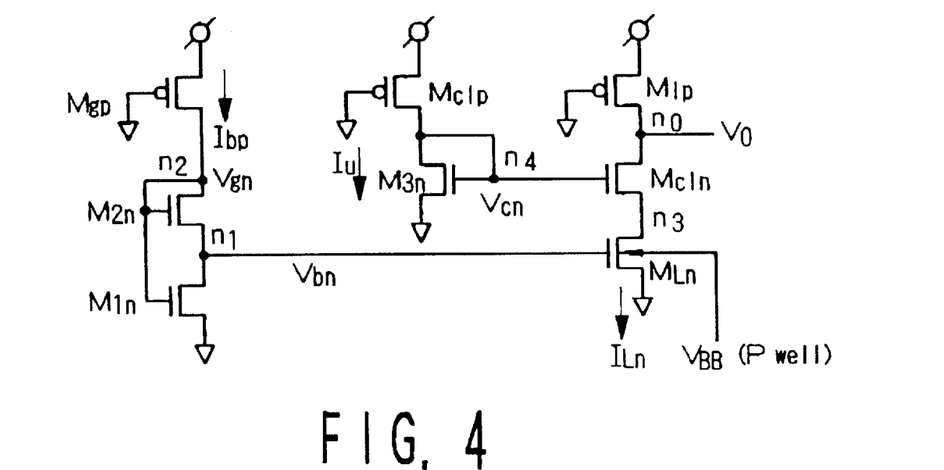
FIG. 4 is a circuit diagram showing a variation of configuration of a third embodiment of this invention.

The configuration of a third embodiment of a semiconductor integrated circuit device according to this invention is shown in FIG. 4. As compared to the configuration of FIG. 1, this semiconductor integrated circuit device is characterized in that an N-channel MOS transistor $M_{c1n}$ is connected between the drain of the load transistor $M_{1p}$ and the drain of N-channel MOS transistor $M_{Ln}$, wherein the gate of an N-channel MOS transistor $M_{3n}$ in which the source is connected to ground potential GND, and the drain and the gate are connected to the drain of an N-channel MOS transistor $M_{c1p}$ serving as a second current source is connected to the gate of the N-channel MOS transistor $M_{c1n}$.

Here, the channel width of the N-channel MOS transistor $M_{c1n}$ is caused to be smaller than the channel width of the N-channel MOS transistor $M_{Ln}$. In this case, channel widths of the N-channel MOS transistor $M_{3n}$ and the N-channel MOS transistor $M_{c1n}$ are selected so that the potential difference between potential $V_{cn}$ of the gate terminal of the N-channel MOS transistor $M_{3n}$ and ground potential GND is substantially equal to the threshold voltages of the N-channel MOS transistor $M_{3n}$ and the N-channel MOS transistor $M_{c1n}$, or is greater than the latter.

In the previously described first embodiment, since potential of the drain of the N-channel MOS transistor $M_{Ln}$ charged through the load (the N-channel MOS transistor) $M_{1p}$ is taken out as $V_O$, delay takes place by charging of the drain capacity of the N-channel MOS transistor $M_{Ln}$ having large channel width.

On the contrary, in the third embodiment, source/drain capacitance of the N-channel MOS transistor $M_{c1n}$ and the drain capacitance of the N-channel MOS transistor $M_{Ln}$ are charged through the load $M_{1p}$, thus to take out potential of the drain of the MOS transistor $M_{1p}$ (or $M_{c1n}$) as $V_O$. In this case, potential of the drain of the N-channel MOS transistor $M_{Ln}$ is raised only by difference between potential $V_{cn}$ of the gate terminal of the N-channel MOS transistor $M_{3n}$ and the threshold voltage of the N-channel MOS transistor $M_{Ln}$ by the clamp action. As a result, the charging time of the drain capacitance of the N-channel MOS transistor $M_{Ln}$ can be reduced to much degree. In addition, since potential of the drain of the N-channel MOS transistor $M_{c1n}$ having smaller channel width as compared to the N-channel MOS transistor $M_{Ln}$ is taken out as $V_O$, the charging time is also short. Accordingly, even if the delay time is sum of the charging time of drain capacitance of the N-channel MOS transistor MLn and the N-channel MOS transistor $M_{c1n}$, the operation can become faster as compared to the first embodiment.

Figure 5:
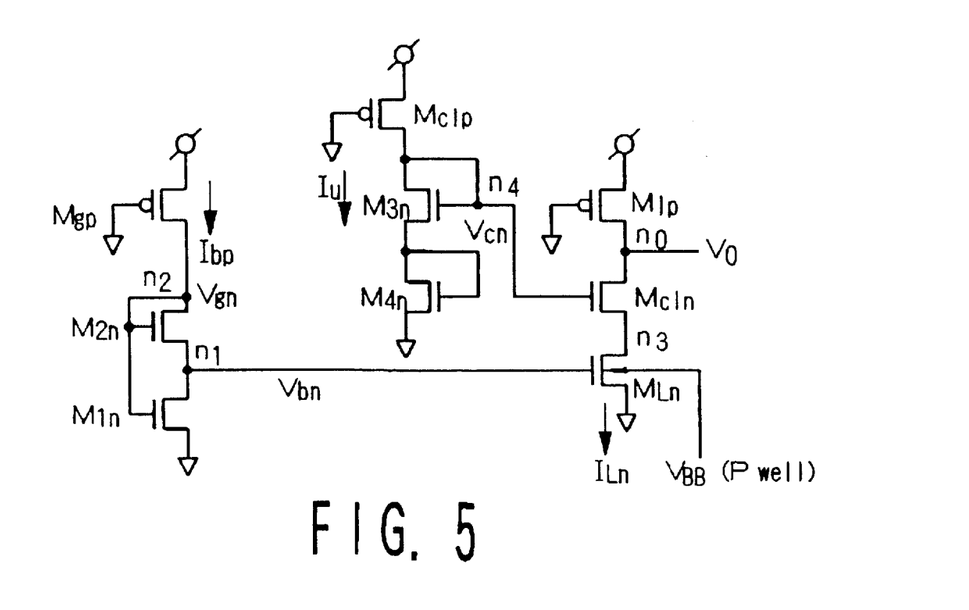
FIG. 5 is a circuit diagram showing a variation of the configuration of FIG. 4.

FIG. 5 shows a variation of third embodiment, in which one stage is added to the configuration between the load $M_{c1p}$ and the ground is further added. Other configuration of FIG. 5 is identical to that of FIG. 4.

Figure 6:
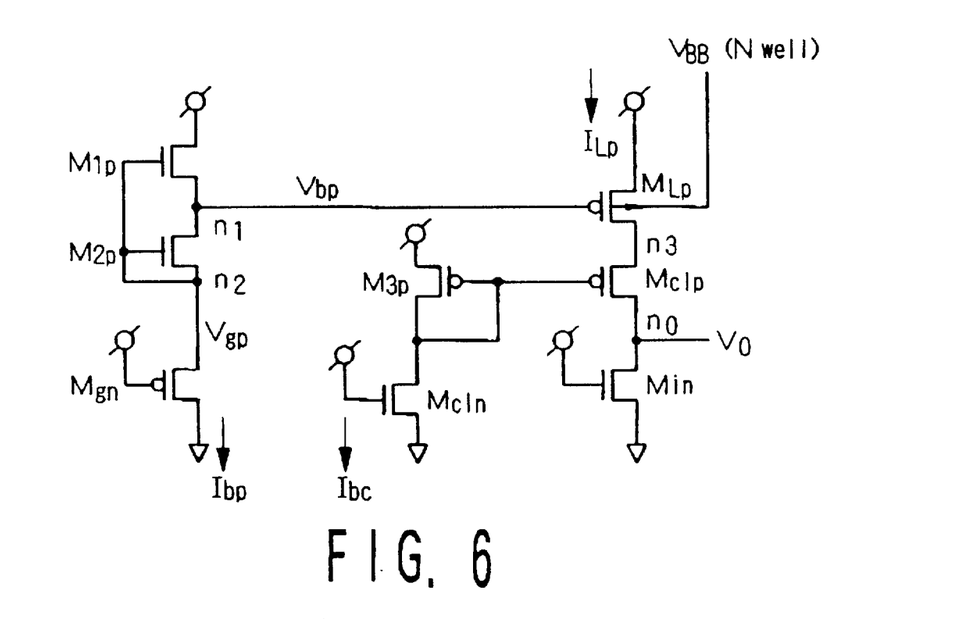
FIG. 6 is a circuit diagram showing a configuration of a fourth embodiment of this invention.

This embodiment solves the problem that it is difficult to increase the gate voltage of the N channel MOS transistor $M_{c1n}$ in FIG. 4 and therefore this low gate voltage limits charge current. For this purpose, in FIG. 5, in order to increase the gate voltage, an additional stage of transistor $M_{4n}$ whose gate and drain are connected to the source of the transistor $M_{3n}$ and the source thereof is grounded is provided. Voltage clamping operation of the two transistors $M_{3n}$ and $M_{4n}$ increases the gate voltage of the transistor $M_{c1n}$ to obtain high speed operation. FIG. 6 shows a fourth embodiment in which conductivity types of respective transistors in the configuration of FIG. 4 are inverted so that the leakage current of the P-channel MOS transistor of LSI can be detected. Since the configuration and the operation are substantially the same as those in the case of FIG. 4, detailed explanation is omitted here.

Figure 7:
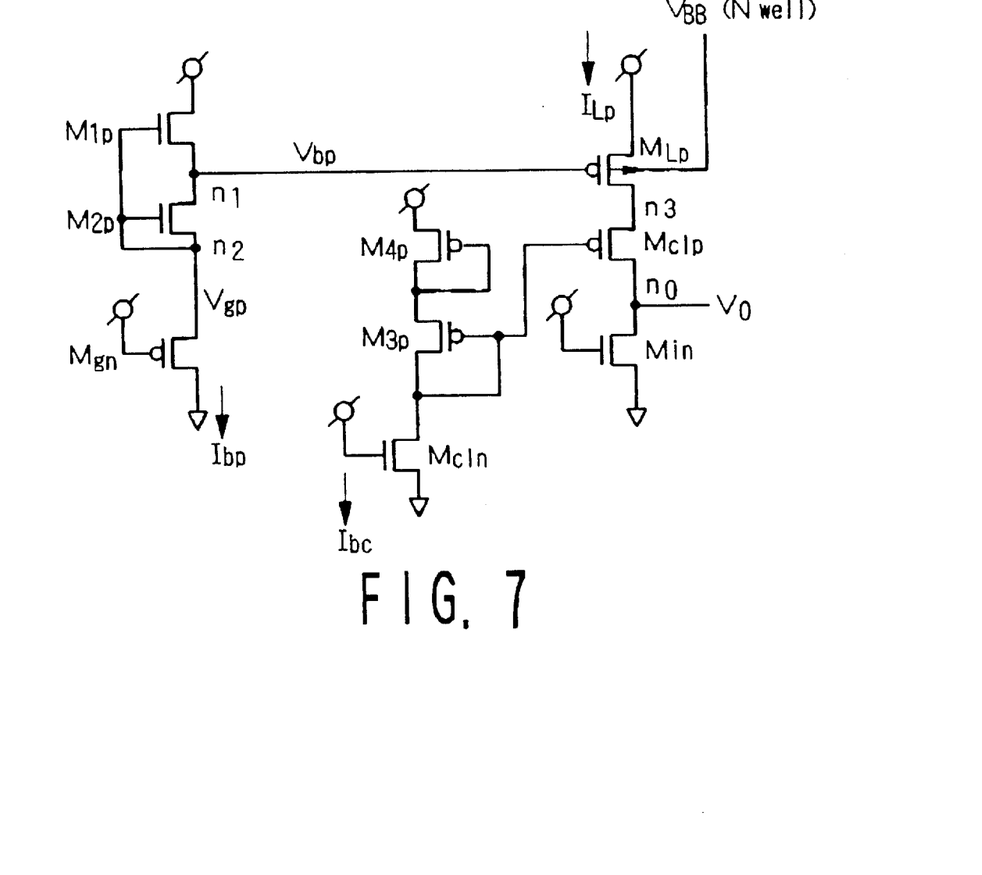
FIG. 7 is a circuit diagram showing a variation of the configuration of FIG. 6.

FIG. 7 shows a variation of the embodiment of FIG. 6, in which a transistor M4p is inserted between the power supply and the transistor M3p in order to increase the gate voltage of the transistor Mc1p which is charged to output $V_O$ thus high speed operation is obtained.

Figure 8:
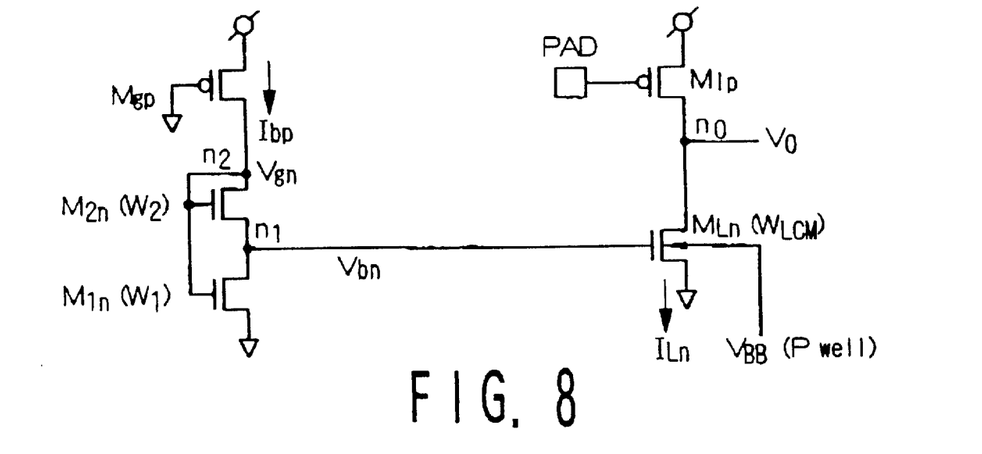
FIG. 8 is a circuit diagram showing a configuration of a fifth embodiment of this invention.

The configuration of a fifth embodiment of the semiconductor integrated circuit device according to this invention is shown in FIG. 8. In this embodiment, potential of the gate terminal of the N-channel MOS transistor $M_{1p}$ which is the load transistor in the first embodiment is caused to be potential on an external input terminal PAD in place of the ground potential GND so that arbitrary voltage can be applied from the external, thus making it possible to detect leakage current by arbitrary value in accordance with the external input voltage.

Figure 11:
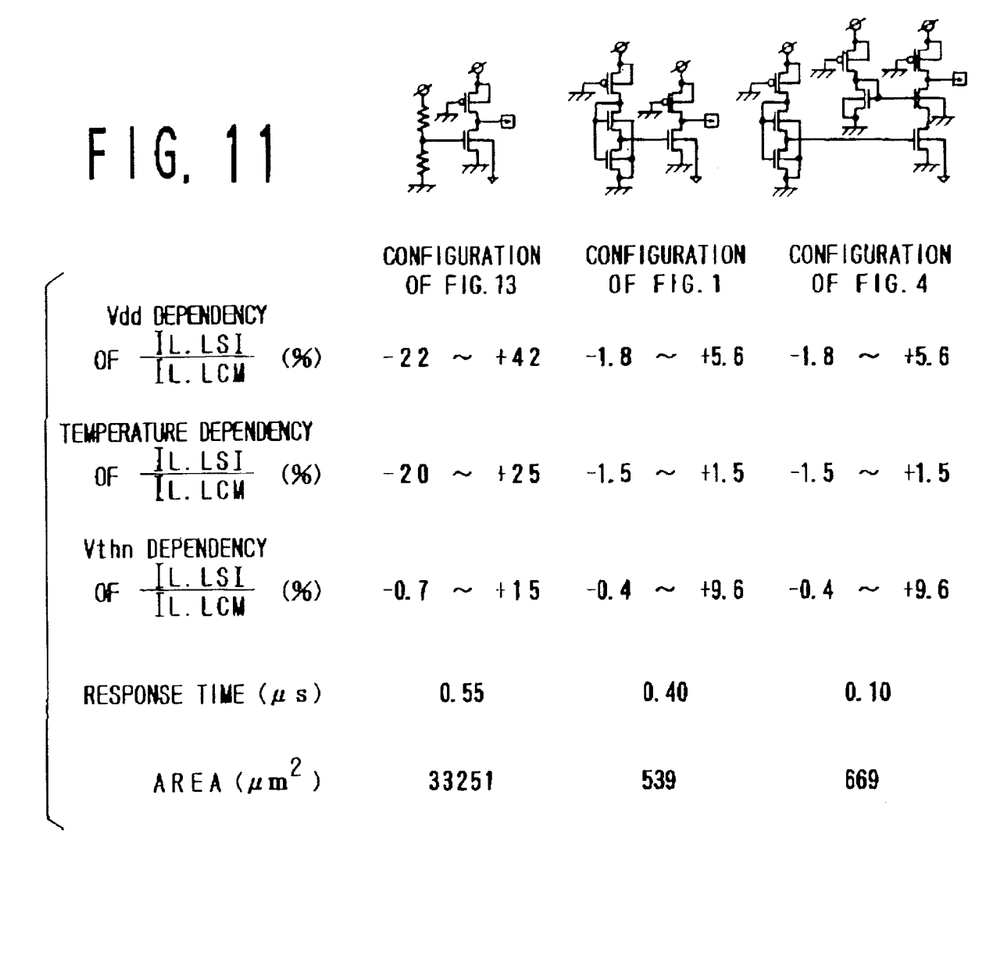
FIG. 11 is a diagrammatical view showing comparison result between performance by the simulation at $V_{th}$=0.2 V of this invention and that of the prior art.
Figure 12:
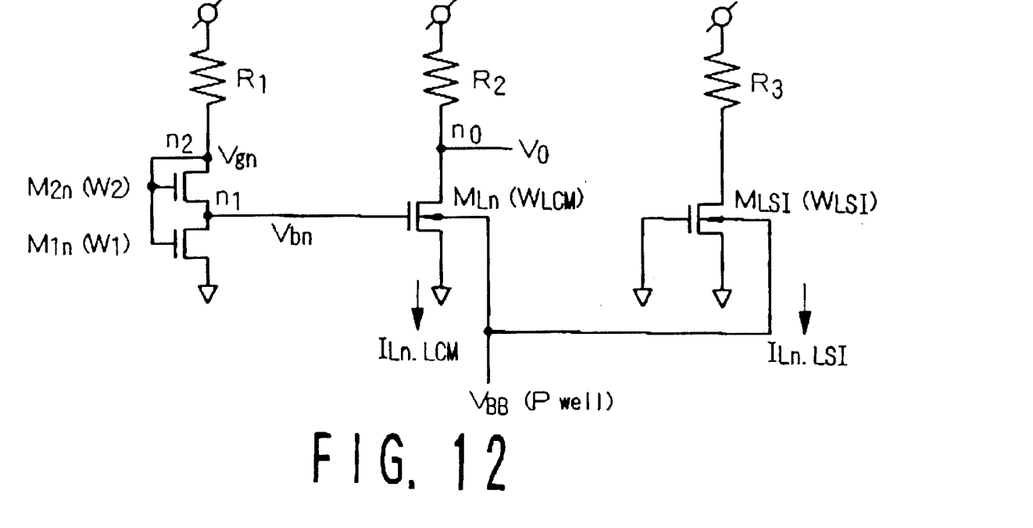
FIG. 12 is a circuit diagram showing a configuration in which resistors are employed as power sources in the first embodiment.

FIG. 11 is a diagrammatical view showing comparison result between performance by the simulation at $V_{th}$=0.2 V of this invention and that of the prior art. In this diagrammatical view, there is shown what percentage the leakage current detection magnification varies as compared to the standard condition when the VDD dependency is caused to be VDD=3.3 V±0.3 V, the temperature dependency is caused to be 0° to 70° C., and the $V_{thn}$ dependency is caused to be $V_{thn}$=0.2 V±0.1 V. It is seen that if the configurations of FIGS. 1 and 4 are employed in respective items, improvement is remarkably made such that change of the leakage current detection magnification is reduced to substantially ⅒. Further, in the case of the configuration of FIG. 4, response time (change of the leakage current detection magnification) is reduced to ¼ as compared to the configuration of FIG. 1 equivalent to the conventional circuit in the fundamental configuration. In addition, since resistor as in the conventional circuit is not required in this invention, it is seen that the area is reduced to ⅟₆₀.

In the above-described respective embodiments, various modifications may be made. While it has been described that, e.g., the current sources are all active element, resistor may be used. In addition, the configuration of this invention may be employed within respective wells of the both conductivity types of the CMOS circuit.

As described above, in accordance with this invention, since voltage formed by two transistors caused to be operative in the sub-threshold region is delivered (applied) to the gate of the leakage current detecting transistor, the leakage current detection magnification does not become dependent upon the power supply voltage or temperature. Thus, detection of the leakage current can be precisely carried out.

Moreover, since the input voltage for the leakage current detection circuit can be produced by the transistors without use of resistor which occupies large area, it is possible to carry out layout of the leakage current detection circuit by small pattern area.

Further, in the invention provided with the configuration for clamping potential on the drain terminal of the leakage current detecting MOS transistor, since potential on the drain of the leakage current detecting MOS transistor has small amplitude, detection of leakage current can be carried out at a high speed.

In addition, in the invention in which the MOS transistor which can freely control gate potential from the external of the chip through the external terminal is used as the load of the leakage current detection circuit, it becomes possible to desirably set the leakage current detection magnification.

What is claimed is:

1. A semiconductor integrated circuit device comprising:
   a first MOS transistor of a first conductivity type having source connected to a first power supply and drain connected to a second power supply through a load;
   a second MOS transistor of the first conductivity type having drain connected to gate of the first MOS transistor of the first conductivity type, source connected to the first power supply, and gate connected to a first current source; and
   a third MOS transistor of the first conductivity type having source connected to the gate of the first MOS transistor of the first conductivity type, drain connected to the first current source, and gate connected to the drain,
   wherein absolute value of difference between potential on the gate of the second MOS transistor and potential of the first power supply is caused to be equal to threshold voltages of the second and the third MOS transistors, or is caused to be lower than the latter, so that the second and third MOS transistors are driven in the sub-threshold region.

2. The semiconductor integrated circuit device as set forth in claim 1,
   wherein the first, second and third transistors are first, second and third N-channel MOS transistors, the first power supply is low potential power supply, and the second power supply is high potential power supply.

3. The semiconductor integrated circuit device as set forth in claim 2,
   wherein substrate potential of the first MOS transistor is P-type well potential which is of opposite conductivity type to the first conductivity type.

4. The semiconductor integrated circuit device as set forth in claim 1,
   wherein the first, second and third MOS transistors are first, second and third P-channel MOS transistors, the first power supply is high potential power supply, and the second power supply is low potential power supply.

5. The semiconductor integrated circuit device as set forth in claim 4,
   wherein substrate potential of the first MOS transistor is N-type well potential which is of opposite conductivity type to the first conductivity type.

6. The semiconductor integrated circuit device as set forth in claim 1,
   wherein a substrate terminal of the third MOS transistor is connected to the source of the third MOS transistor.

7. The semiconductor integrated circuit device as set forth in claim 2,
   wherein a potential of a ground power supply or a predetermined potential lower than the ground power supply potential is supplied to a substrate terminal of the second and third MOS transistors.

8. The semiconductor integrated circuit device as set forth in claim 4,
   wherein a potential of the first power supply or a predetermined potential higher than the potential of the first power supply is supplied to a substrate terminal of the second and third MOS transistors.

9. The semiconductor integrated circuit device as set forth in claim 2,
   wherein the predetermined potential is provided as an output of a gate of a fourth MOS transistor of the first conductivity type having source connected to the ground power supply, drain and gate connected to a second current source.

10. The semiconductor integrated circuit device as set forth in claim 4,
    wherein the predetermined potential is provided as an output of a gate of a fourth MOS transistor of the first conductivity type having source connected to the ground power supply, drain and gate connected to a second current source.

11. The semiconductor integrated circuit device as set forth in claim 9,
    wherein the first and second current sources are first and second P-channel MOS transistors having gate connected to the ground power supply, source connected to the high potential power supply and drain connected to drain of the third MOS transistor and the fourth MOS transistor, respectively.

12. The semiconductor integrated circuit device as set forth in claim 10,
    wherein said first and second current sources are first and second N channel MOS transistors having gate connected to the high potential power supply, source connected to the ground power supply and drain connected to drain of the third MOS transistor and the fourth MOS transistor, respectively.

13. The semiconductor integrated circuit device as sat forth in claim 9,
    wherein the first and second current sources are resistors.

14. The semiconductor integrated circuit device as set forth in claim 10,
    wherein the first and second current sources are resistors.

15. The semiconductor integrated circuit device as set forth in claim 11,
    wherein the load is a third P channel MOS transistor having gate connected to the ground power supply, source connected to the power supply, and drain connected to the drain of the first or fourth MOS transistor.

16. The semiconductor integrated circuit device as set forth in claim 12,
    wherein the load is a third N channel MOS transistor having gate connected to the power supply, source connected to the ground power supply, and drain connected to the drain of the first or fourth P channel MOS transistor.

17. A semiconductor integrated circuit device comprising:
    a first MOS transistor of a first conductivity type of which source is connected to a first power supply;
    a second MOS transistor of the first conductivity type having drain connected to gate of the first MOS transistor of the first conductivity type, source connected to the first power supply, and gate connected to a current source;
    a third MOS transistor of the first conductivity type having source connected to the gate of the first MOS transistor of the first conductivity type, drain connected to the current source, and gate connected to the drain; and
    a fourth MOS transistor of the first conductivity type having source connected to drain of the first MOS transistor of the first conductivity type, drain connected to a second power supply through a load, and gate to which a predetermined potential is applied, wherein absolute value of difference between potential on the gate of the second MOS transistor of the first conductivity type and potential of the first power supply is caused to be equal to threshold voltages of the second and third MOS transistors of the first conductivity type, or is caused to be lower than the latter so that the second and third MOS transistors of the first conductivity type are driven in the sub-threshold region, and the channel width of the fourth MOS transistor of the first conductivity type is caused to be smaller than the channel width of the first MOS transistor of the first conductivity type.

18. The semiconductor integrated circuit device as set forth in claim 17, wherein the first, second, third and fourth MOS transistors of the first conductivity type MOS are first, second, third and fourth N channel MOS transistors, the first power supply is low potential power supply, and the second power supply is high potential power supply.

19. The semiconductor integrated circuit device as set forth in claim 18, wherein substrate potential of the first MOS transistor of the first conductivity type is P-type well potential which is of the opposite conductivity type to the first conductivity type.

20. The semiconductor integrated circuit device as set forth in claim 17, wherein said first, second, third and fourth MOS transistors of first conductivity type MOS are first, second, third and fourth P-channel MOS transistors, the first power supply is high potential power supply, and the second power supply is low potential power supply.

21. The semiconductor integrated circuit device as set forth in claim 20, wherein substrate potential of the first MOS transistor of the first conductivity type is N-type well potential which is of opposite conductivity type to the first conductivity type.

22. The semiconductor integrated circuit device as set forth in claim 18, wherein the predetermined potential is given as a gate output of a fifth N-channel MOS transistor having source connected to ground power supply, and drain and gate connected to a second current source.

23. The semiconductor integrated circuit device as set forth in claim 20, wherein the predetermined potential is given as a gate output of a fifth P-channel MOS transistor having source connected to a ground power supply, and drain and gate connected to a second current source.

24. The semiconductor integrated circuit device as set forth in claim 17, wherein a substrate terminal of the third MOS transistor of the first conductivity type is connected to the source of the third MOS transistor of the first conductivity type.

25. The semiconductor integrated circuit device as set forth in claim 18, wherein potential of the ground power supply or a potential lower than that is applied to substrate terminals of the second and third MOS transistors of the first conductivity type.

26. The semiconductor integrated circuit device as set forth in claim 20, wherein potential of the first power supply or a potential higher than that is applied to substrate terminals of the second and third MOS ransistors.

27. The semiconductor integrated circuit device as set forth in claim 22, wherein said first and second current sources are first and second P channel MOS transistors having gate connected to the ground power supply, source connected to the power supply and drain connected to drain of the third or fifth N channel MOS transistor.

28. The semiconductor integrated circuit device as set forth in claim 23, wherein said first and second current sources are first and second N channel MOS transistors having gate connected to the power supply, source connected to ground power supply and drain connected to drain of the third or fifth P channel MOS transistor.

29. The semiconductor integrated circuit device as set forth in claim 22, wherein the first current source and the second current source are resistors.

30. The semiconductor integrated circuit device as set forth in claim 23, wherein the first current source and the second current source are resistors.

31. The semiconductor integrated circuit device as set forth in claim 27, wherein said load is a third P channel MOS transistor having gate connected to the ground power supply, source connected to the power supply, and drain connected to the drain of the first or fourth N channel MOS transistor.

32. The semiconductor integrated circuit device as set forth in claim 28, wherein said load is a third N channel MOS transistor having gate connected to the power supply, source connected to the ground power supply, and drain connected to the drain of the first or fourth P channel MOS transistor.

33. The semiconductor integrated circuit device as set forth in claim 17, wherein said predetermined potential supplied to the gate of said fourth MOS transistor of the first conductivity type is given as a clamped voltage of the first and second power supply voltages by at least two stages of series connected transistors.

34. A semiconductor integrated circuit device comprising:

a first MOS transistor of a first conductivity type of which source is connected to a first power supply, drain terminal thereof being connected to a second power supply through a load;

a second MOS transistor of the first conductivity type having drain connected to gate of the first MOS transistor of the first conductivity type, source connected to the first power supply, and gate connected to a current source; and a third MOS transistor of the first conductivity type having source connected to the gate of the first MOS transistor of the first conductivity type, drain connected to the current source, and gate connected to the drain;

wherein said load is a MOS transistor of the second conductivity type of which gate is connected to an external terminal, and wherein absolute value of difference between potential on the gate of the second MOS transistor of the first conductivity type and potential of the first power supply is caused to be equal to threshold voltages of the second and third MOS transistors of the first conductivity type, or is caused to be lower than the latter so that the second and third MOS transistors of the first conductivity type are driven in the sub-threshold region, and current detection rate is caused to be variable by gate potential set by external terminal.

35. The semiconductor integrated circuit device as set forth in claim 34, wherein the first, second and third MOS transistors are first, second and third N channel MOS transistors and the load is a P-channel MOS transistor having source connected to a power supply, drain connected to the drain of the first N-channel MOS transistor.

36. The semiconductor integrated circuit device as set forth in claim 34, wherein the first, second and third MOS transistors are first, second and third P channel MOS transistors and the load is an N-channel MOS transistor having source connected to a ground power supply, drain connected to the drain of the first P-channel MOS transistor.

* * * * *